(12) United States Patent
Franzon

(10) Patent No.: US 9,568,546 B2
(45) Date of Patent: Feb. 14, 2017

(54) DELAY FAULT TESTING FOR CHIP I/O

(75) Inventor: Paul D. Franzon, New Hill, NC (US)

(73) Assignee: Rambus Inc., Sunnyvale, CA (US)

( * ) Notice: Subject to any disclaimer, the term of this patent is extended or adjusted under 35 U.S.C. 154(b) by 537 days.

(21) Appl. No.: 13/982,471

(22) PCT Filed: Feb. 15, 2012

(86) PCT No.: PCT/US2012/025311
§ 371 (c)(1),
(2), (4) Date: Jul. 29, 2013

(87) PCT Pub. No.: WO2012/115840
PCT Pub. Date: Aug. 30, 2012

(65) Prior Publication Data
US 2013/0314102 A1    Nov. 28, 2013

Related U.S. Application Data

(60) Provisional application No. 61/446,386, filed on Feb. 24, 2011.

(51) Int. Cl.
*G01R 31/317*    (2006.01)
(52) U.S. Cl.
CPC ... *G01R 31/31712* (2013.01); *G01R 31/31725* (2013.01)
(58) Field of Classification Search
CPC ........... H03K 5/135; H03K 5/133; G11C 7/22; G11C 7/222; H04L 7/0025; H04L 7/0337; G01R 31/31716; G01R 31/26; G01R 31/2601; G01R 31/2607; G01R 31/2851; G01R 31/2853; G01R 31/318513; G01R 31/2884; G01R 31/2648; G01R 31/2642; G01R 31/2896; G01R 31/32; H01L 22/34; H01L 2924/00; H01L 22/14
See application file for complete search history.

(56) References Cited

U.S. PATENT DOCUMENTS

| 5,568,492 A | 10/1996 | Flint et al. |
| 6,055,661 A | 4/2000 | Luk |
| 6,286,119 B1 * | 9/2001 | Wu ................... G01R 31/31858 712/227 |

(Continued)

OTHER PUBLICATIONS

Haioun, Eric et al., "At-Speed Scan Transition and Path Delay Testing Using On-Chip PLL for High Frequency Device and Low Frequency Tester," Euro DesignCon 2005, Oct. 24-27, 2005. 23 pages.

(Continued)

*Primary Examiner* — Alesa Allgood

(57) ABSTRACT

An integrated circuit (IC) chip is provided. The IC chip includes a signal output via which an outgoing signal is transmitted, and a signal input via which an incoming data signal is received. Also included on the IC ship is a pass circuit to couple the signal output to the signal input during testing of the IC chip. Furthermore, a delay circuit produces a first timing signal and a second timing signal during testing of the IC chip. The second timing signal is delayed from the first timing signal according to a test parameter. The first timing signal triggers transmission of a test signal via the signal output, and the second timing signal triggers sampling of the received test signal via the signal input.

16 Claims, 7 Drawing Sheets

(56) References Cited

U.S. PATENT DOCUMENTS

| | | | |
|---|---|---|---|
| 6,477,674 B1* | 11/2002 | Bates | G01R 31/31716 714/738 |
| 6,479,983 B1 | 11/2002 | Ebiya | |
| 2005/0207076 A1* | 9/2005 | Josephson | G01R 31/3004 361/56 |
| 2007/0061649 A1 | 3/2007 | Kim | |
| 2009/0161879 A1* | 6/2009 | Yanagawa | H04R 5/04 381/17 |
| 2009/0296504 A1* | 12/2009 | Ishikawa | G11C 29/12 365/201 |
| 2010/0120369 A1* | 5/2010 | Ko | H04B 1/40 455/67.11 |

OTHER PUBLICATIONS

International Search Report and Written Opinion of the International Searching Authority re PCT/US2012/025311 filed Feb. 15, 2012 mailed Nov. 1, 2012. 10 pages.

Notification Concerning Transmittal of IPRP on Patentability of the International Searching Authority re PCT/US2012/025311 filed Feb. 15, 2012 mailed Sep. 6, 2013. 7 pages.

* cited by examiner

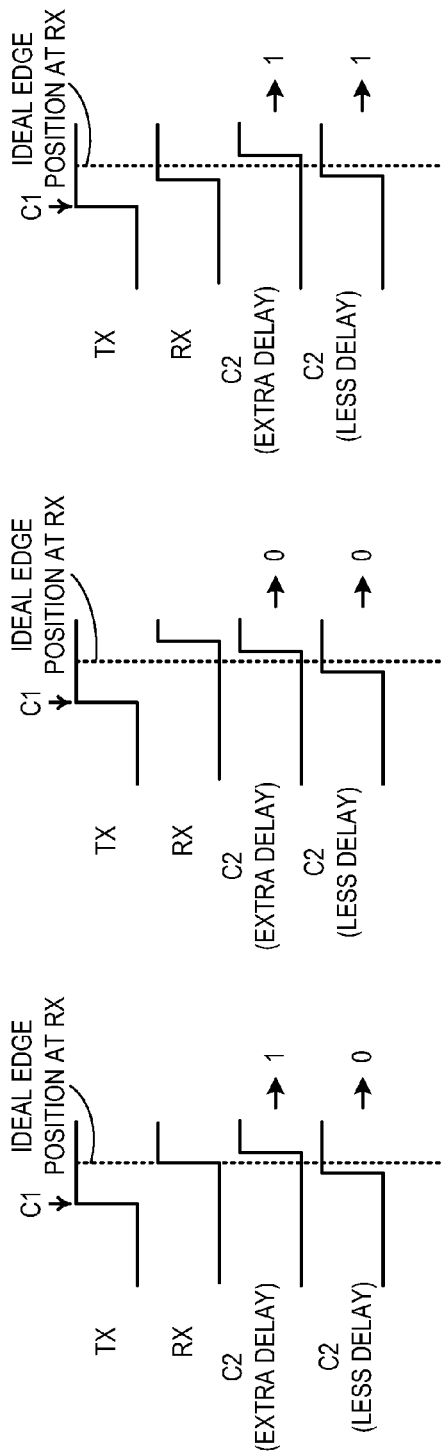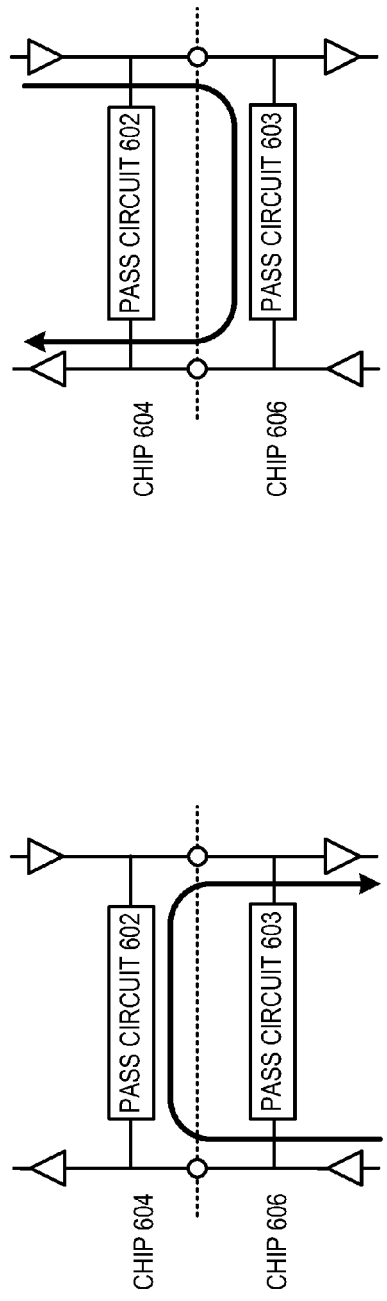

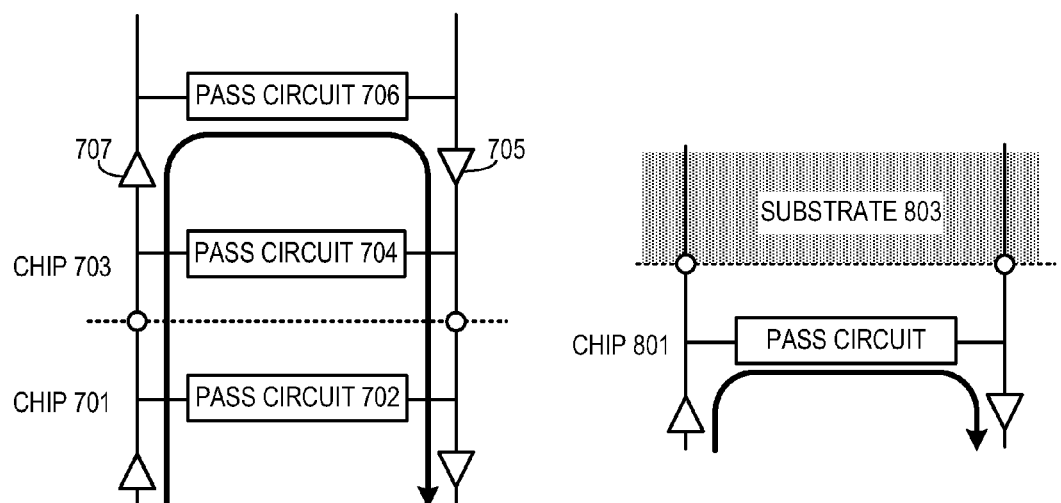
FIG. 7
FIG. 8
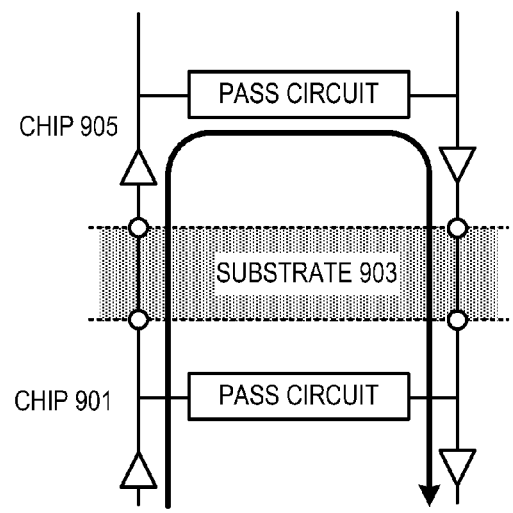
FIG. 9

DELAY FAULT TESTING FOR CHIP I/O

This disclosure is 35 USC §371 entry of Patent Cooperation Treaty Application No. PCT/US2012/025311 (filed on Feb. 15, 2012), which in turn claims priority to U.S. Provisional Patent Application No. 61/446,386, filed on Feb. 24, 2011. Each of these prior applications was filed for "Delay Fault Testing For Chip I/O" on behalf of inventor Paul D. Franzon. Each of these prior applications is hereby incorporated by reference.

TECHNICAL FIELD

The present disclosure general relates to circuits, systems, and techniques for testing chip input/output (I/O).

BACKGROUND

In a 3D chip stack there might be thousands of interconnections communicating vertically between chips in the stack. It is important that the chips in the stack are tested before integration. If they are not tested, the yield of the assembled chip stack could be overly degraded. In many circumstances probe testing of the I/O might not be practical, for a variety of reasons. For example, the probe pitch is likely to be very fine, making the probe card expensive. The microbumps could be damaged by the probe tips. The large number of I/Os being tested could also result in an expensive probe card. In addition, more high speed test channels might be required in the tester equipment, increasing its cost. Nevertheless, it remains important to speed-test the I/Os to ensure desired performance.

BRIEF DESCRIPTION OF THE FIGURES

FIGS. 5A, 5B, and 5C illustrates different delay configurations in the delay fault testing circuit for detecting delay faults, in accordance with one embodiment.

FIGS. 6A and 6B illustrates two exemplary configurations for testing delay faults between two stacked chips, in accordance with one embodiment.

FIG. 7 illustrates an exemplary configuration for testing delay faults via a different signal path between two stacked ships, in accordance with one embodiment.

FIG. 8 illustrates an exemplary configuration for testing delay faults between a chip and a substrate, in accordance with one embodiment.

FIG. 9 illustrates an exemplary configuration for testing delay faults through a stack of two chips and a substrate, in accordance with one embodiment.

In the figures, like reference numerals refer to the same figure elements.

DETAILED DESCRIPTION

In embodiments of the present disclosure, the problem of on-chip I/O delay fault testing without introducing significant parasitic capacitance is solved by using a low-capacitance loop-back circuit to couple the output to the input, and delaying the sampling at the input after a test signal is transmitted via the output. Low capacitance is desirable because the parasitic capacitance associated with the loop-back circuit remains during normal operation, which adds delay to the connection timing and increases power consumption of the interface. This circuit configuration can also be used to test delay faults of a chip stack post assembly.

Ideally, a chip or chip stack should not contain voids or cracks. In reality, however, the fabrication process can introduce a variety of defects. For example, leaky cracks often result in increased resistance. Voids and non-leaky cracks could lead to decreased capacitance. Short circuits to ground and voids in the through-silicon via (TSV) sidewall can increase current leakage. All of these defects can change the resistor-capacitor (RC) characteristics of the interconnect loading and hence lead to faulty signal delays.

Embodiments of the present disclosure provide a design-for-test (DFT) configuration that uses an on-chip loop-back circuit (referred to as "pass circuit" herein) to provide a signal path between an output and input on the chip for testing purposes. This configuration which obviates the need for external probes. One design constraint, however, is that the pass circuit introduces additional parasitic capacitance to the I/O, which results in additional delay to the non-test signals. To minimize this delay, in one embodiment, the pass circuit uses a pass gate with minimal size (hence minimal input capacitance), so that the extra delay is negligible. Nonetheless, a small pass gate also comes with larger resistance, which leads to higher delays to the test. To address this test-signal delay, the sampling at the receiver is delayed from the transmission at the driver. This sampling delay can be programmed based on the delay introduced by the pass circuit as well as different test configurations. Hence, the testing circuit can detect delay faults (i.e., delays smaller or greater than expected) in various chip stack configurations without using external I/O probes and introducing significant parasitic capacitance.

Figure 1:
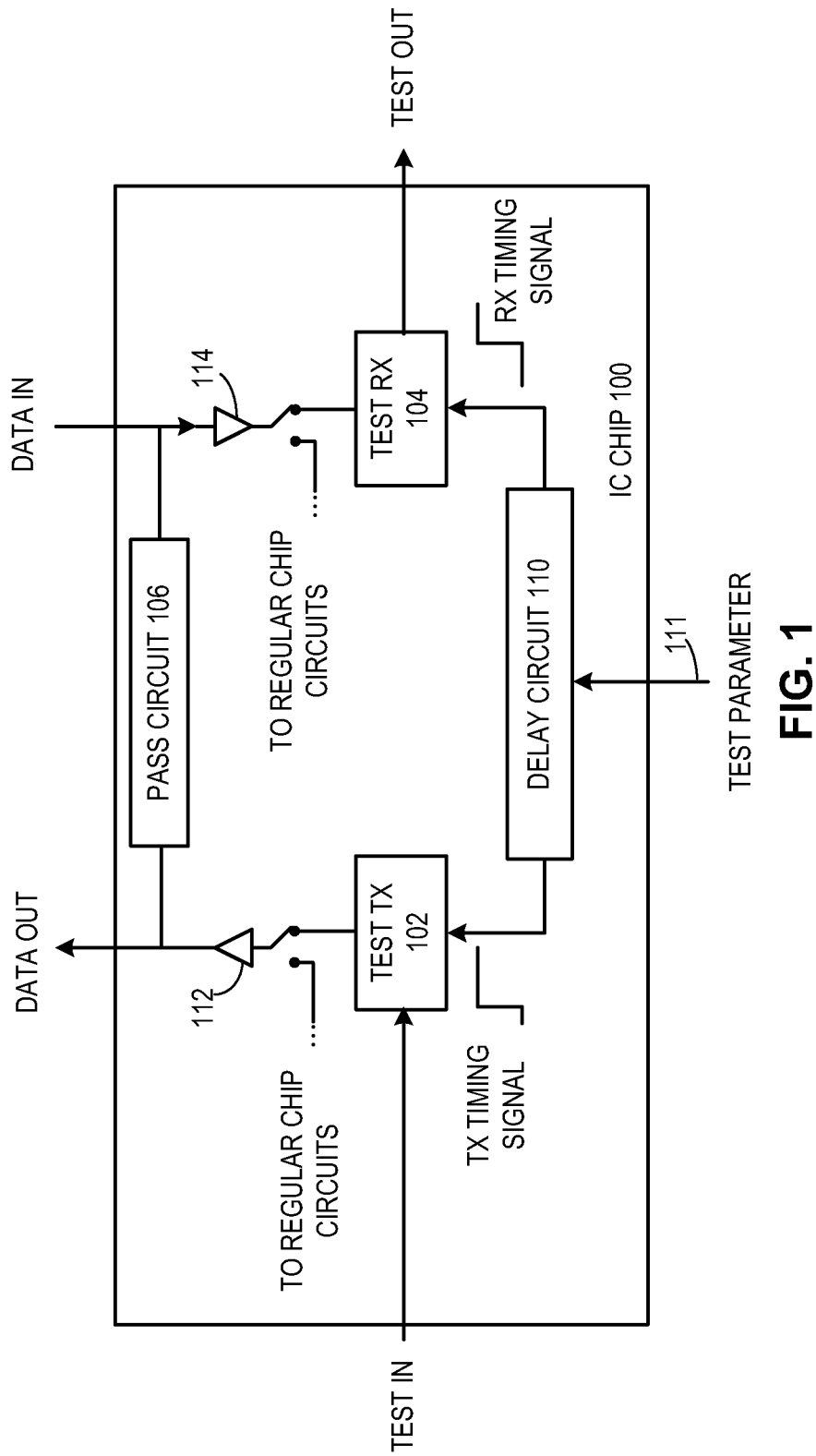
FIG. 1 presents a block diagram illustrating an exemplary on-chip delay fault testing circuit, in accordance with one embodiment.

FIG. 1 presents a block diagram illustrating an exemplary on-chip delay fault testing circuit, in accordance with one embodiment. In this example, an IC chip 100 includes an output driver 112, an input receiver 114, a pass circuit 106, a test signal transmission module 102, a test signal receiving module 104, a delay circuit 110, and a test parameter input port 111. Pass circuit 106 couples the output of driver 112 to the input of receiver 114. During normal operation, pass circuit 106 is turned off to de-couple driver 112 from receiver 114. Driver 112 can couple to test signal transmission module 102 during testing. Similarly, receiver 114 can couple to test signal receiving module 104 during testing, and couple to regular circuits during normal operation. Delay circuit 110 produces a transmission timing signal and a sampling timing signal to trigger transmission module 102 and receiving module 104, respectively. The sampling timing signal is delayed from the transmission timing signal to account for the delay introduced by pass circuit 106.

During testing, a test signal is provided (for example, by external testing equipment) to transmission module 102, which is triggered by the transmission timing signal to transmit the test signal via driver 112. The test signal traverses pass circuit 106 and is received by receiver 114. Receiving module 104 is then triggered by the delayed sampling timing signal to sample the test signal. The sample result is subsequently compared with the original test signal to determine whether the actual delay is within an expected range.

The delay between the transmission timing signal and sampling timing signal can be programmed. In one embodiment, as shown in FIG. 1, a piece of external testing equipment can provide a test parameter, such as a delay value, to delay circuit 110 via test parameter input port 111. Test parameter input port 111 can be a serial or parallel port. As described below in conjunction with FIGS. 5A-5C, the delay value can be decreased or increased with respect to the expected delay, so that different sampling results can be obtained. Based on these different sampling results, the testing equipment can determine whether the actual delay of the I/O is smaller or greater than expected.

Figure 2A:
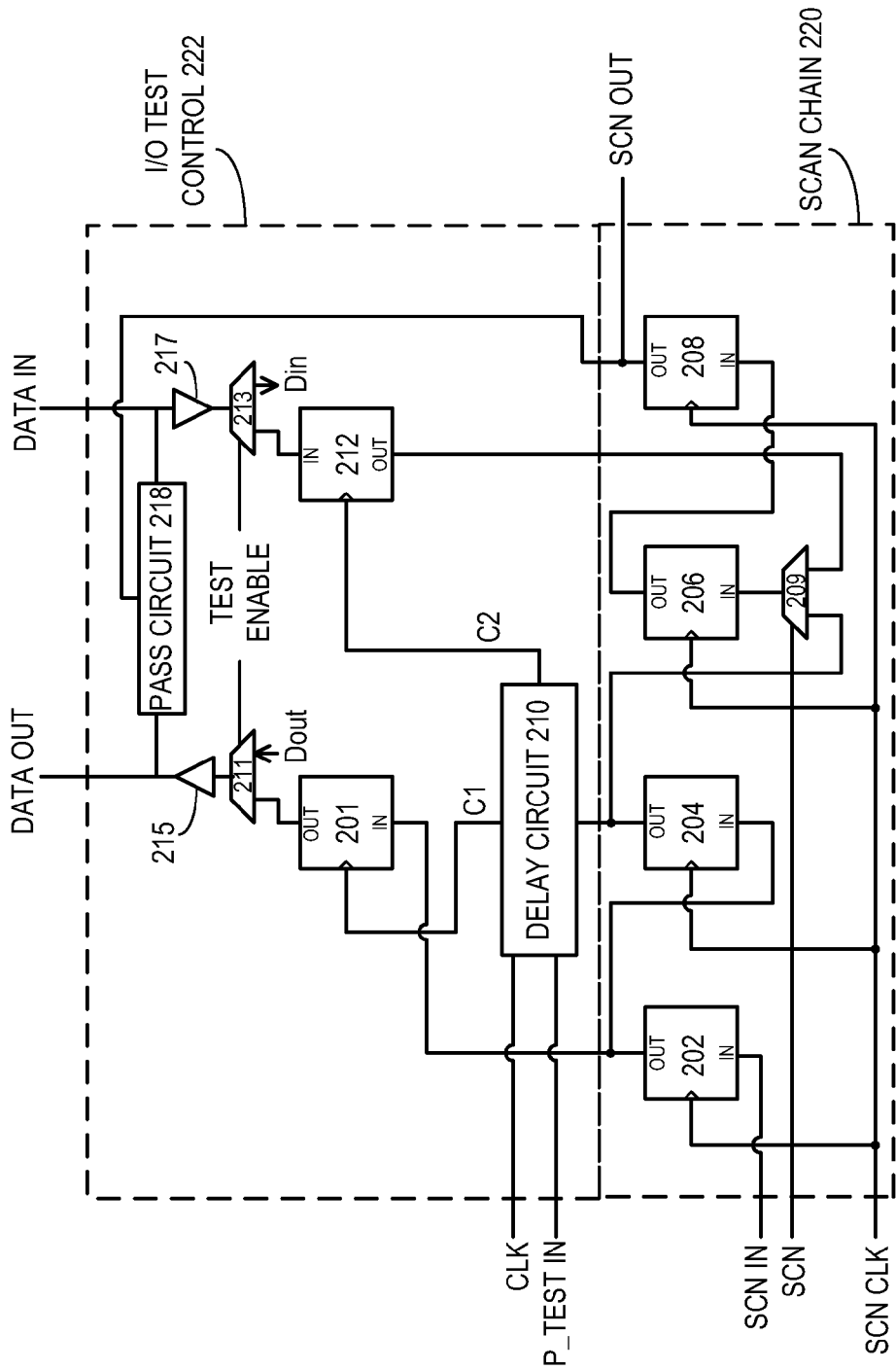
FIG. 2A presents a diagram illustrating an exemplary on-chip delay fault testing circuit, in accordance with one embodiment.

FIG. 2A presents a diagram illustrating an exemplary on-chip delay fault testing circuit, in accordance with one embodiment. The testing circuit includes a scan chain 220 and an I/O test control circuit 222. Scan chain 220 includes four registers, 202, 204, 206, and 208, and a multiplexer 209. I/O test control circuit 222 includes a delay circuit 210, a transmission flip-flop 201, a transmission multiplexer 211, a transmission driver 215, a sampler flip-flop 212, a sampler multiplexer 213, a receiver 217, and a pass circuit 218.

In scan chain 220, the four registers 202, 204, 206, and 208 form a 4-bit shift register to store a scan vector received serially via a scan in ("SCN IN") port through four scan clock ("SCN CLK") cycles. The SCN IN port serves as a test signal input port for receiving a scan vector into scan chain 220. When the scan vector is loaded, the control signal for multiplexer 209 ("SCN") is set such that the input of flip-flop 206 is coupled to the output of flip-flop 204. The first bit in the scan vector, which is stored in flip-flop 202, is the test signal and is fed into transmission flip-flop 201. The second bit, which is stored in flip-flop 204, is fed into delay circuit 210 and serves as a start signal to enable delay circuit 210 to generate two timing signals, C1 and C2 (described below). The third bit in the scan vector, which is stored in flip-flop 206, is an optional bit. The fourth bit in the scan vector, which is stored in flip-flop 208, enables pass circuit 218.

After the scan vector has been loaded, the bit stored in flip-flop 204 enables delay circuit 210. The bit stored in flip-flop 208 enables pass circuit 218, so that the driver on the output is looped back to the receiver on the input. Upon receiving the start signal from flip-flop 204, delay circuit 210 produces two timing signals, C1 and C2, based on an on-chip clock signal ("CLK"). Delay circuit 210 can accept external test parameters to program the delay between C1 and C2 via a test parameter input port (denoted as "P_TEST IN"). C1 is used to trigger transmission flip-flop 201, which outputs the test signal (first bit in the scan vector) to driver 215. Note that multiplexer 211 is set by a test enable signal such that driver 215 is coupled to the output flip-flop 201 during testing. During normal operation, multiplexer 211 couples driver 215 to the regular output data from the chip. Similarly, multiplexer 213 is set to couple receiver 217 to flip-flop 212 during testing, and regular input data during normal operation.

Timing signal C2 is used to trigger flip-flop 212, which samples the test signal received by receiver 217. After sampling, flip-flop 212 outputs the detected test signal to one of the inputs of multiplexer 209. Subsequently, SCN is set to allow the sampled test signal to be passed to the input of flip-flop 206 (as opposed to the output of flip-flop 204 when the scan vector is loaded). At the next triggering edge of SCN CLK, flip-flop 206 outputs the sampled test signal to the input of flip-flop 208, which in turn outputs the test signal to the SCN OUT port at the following SCN CLK cycle.

Figure 2B:
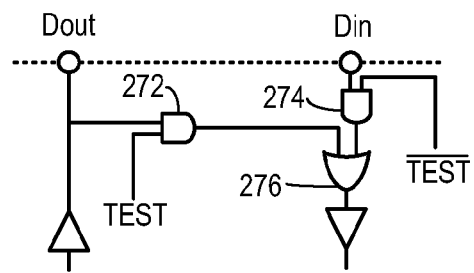
FIG. 2B illustrates an exemplary pass circuit between the output and input on a chip, in accordance with one embodiment.

Pass circuit 218 can be implemented in various ways. For example, pass circuit 218 can include a pass gate, a tri-state gate, a multiplexer, or a combination of logic gates. FIG. 2B illustrates an exemplary pass circuit based on a two AND gates 272 and 274, and an OR gate 276. The test enable signal (denoted as "TEST," which is the output of flip-flop 208 in FIG. 2A) and its compliment turn on and off the pass circuit.

Figure 3:
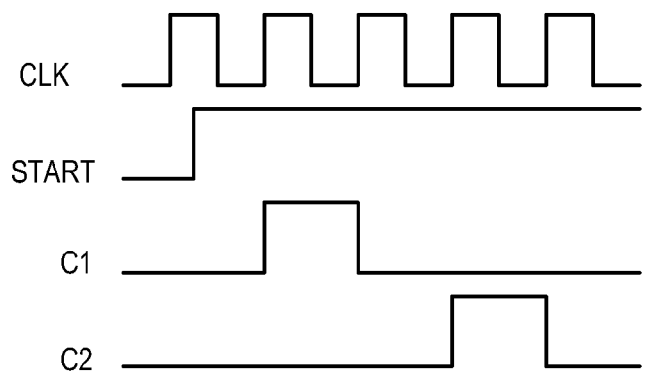
FIG. 3 presents an exemplary timing diagram illustrating two timing signals used in the on-chip delay fault testing circuit, in accordance with one embodiment.

FIG. 3 presents an exemplary timing diagram illustrating the two timing signals. As described above, the delay circuit can use an on-chip clock ("CLK") as its reference. Such on-chip clock can be produced by a phase lock loop (PLL) on the chip, if the clock is distributed externally. When the delay circuit is enabled by the START signal (the second bit in the scan vector), timing signal C1 is produced at the next rising edge of CLK. The second timing signal C2 is then produced after an amount of delay determined by a test parameter, which can be internally generated or externally provided. The amount of delay between C1 and C2 in this example is two CLK cycles.

Without losing generality, the delay between C1 and C2 can be programmable to reflect the delay introduced by the pass circuit as well as the native delay in the interconnects. Furthermore, various circuit designs can be used to implement the programmable delay function. For example, the delay circuit can include a programmable digital delay circuit, a programmable analog delay circuit (such as an analog delay vernier circuit), or a combination of both. In one embodiment, C1 can correspond to a rising edge of CLK, and C2 can correspond to a falling edge of CLK. This way, the resolution of the delay can be effectively half the CLK cycle, assuming a 50% duty cycle. In addition, vernier circuits can be used to further adjust the delay between C1 and C2 to achieve a sub-clock-cycle timing resolution.

Figure 4:
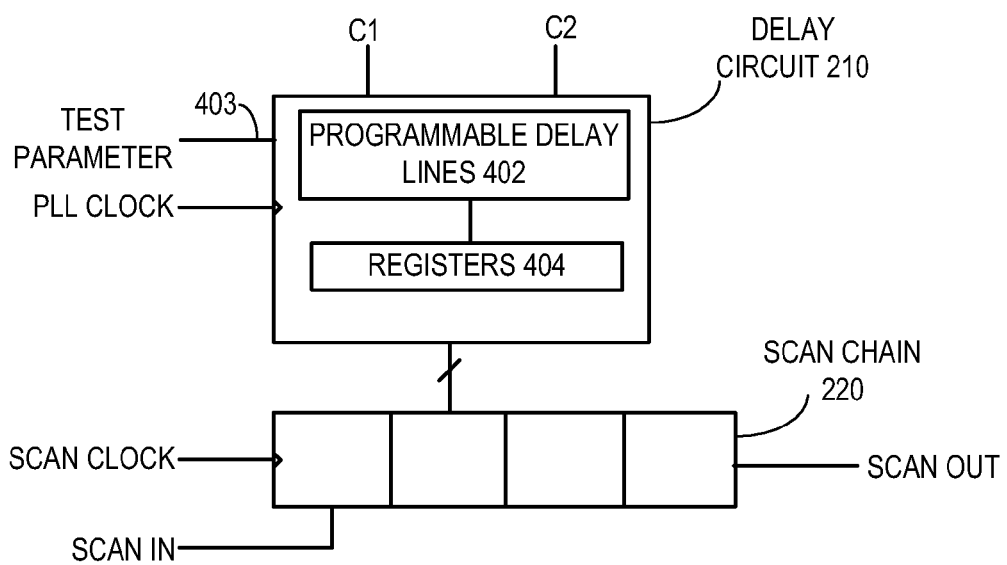
FIG. 4 illustrates an exemplary implementation of the delay circuit, in accordance with one embodiment.

In one embodiment, the amount of C1/C2 delay produced by the delay circuit is calculated from a value loaded into a shift register from the test head. The shift register could be part of the scan chains on the chip. As described above, different values could be loaded to test the delay faults. FIG. 4 illustrates an exemplary implementation of delay circuit 210. In this example, delay circuit includes a set of programmable delay lines 402 and a number of registers 404. Programmable delay lines 402 can be based on any type of digital or analog delay circuit. Registers 404 can store the delay value, which is used to generate C1 and C2.

Since the delay between C1 and C2 can be programmed, it is possible to use different C1/C2 delays to detect delay faults in the chip. A test parameter, such as a C1/C2 delay value, can be loaded into programmable delay lines 402 via a test parameter input port 403. FIG. 5A illustrate an example where the signal path is healthy and the test signal propagates from the output to the input with expected delay. In this example, the test signal has a value of "1" and the transmitter transmits the test signal at the rising edge of C1. The ideal signal transition edge at the receiver is indicated by a dotted line. Assume that the actual received signal transition is approximately at the ideal position. In a first test, C2 is delayed after C1 by more than the ideal delay amount (the rising edge of C2 is after the dotted line). As a result, the sampled scan out value is "1." In a second test, C2 is delayed after C1 by less than the ideal delay amount (the rising edge of C2 is before the dotted line). As a result, the sampled scan out value is "0." Therefore, when the test signal is "1" and the I/O functioning properly with the correct amount of delay, the two scan outputs with more-than-ideal and less-than-ideal C2 delays would be "1" and "0," respectively.

Now, assume that due to defects the signal path introduces a greater-than-ideal amount of delay beyond an acceptable range, as illustrated in FIG. 5B. The test signal edge received by the receiver is positioned after dotted line. In a first test where C2 is delayed by a more than ideal delay amount but still within the acceptable range, the sampled scan out value would be "0," because the actual received test signal edge is after C1's rising edge. In a second test where C2 is delayed by less than the ideal delay amount but still within the acceptable range, the sampled scan out value would also be "0." Therefore, when the test signal is "1" and the I/O introduces a greater than ideal amount of delay beyond an acceptable range, the two scan outputs with more-than-ideal and less-than-ideal C2 delays would both be "0."

Assume further that due to defects the signal path introduces a less-than-ideal amount of delay beyond an acceptable range, as illustrated in FIG. 5C. The test signal edge received by the receiver is positioned before the dotted line. In a first test where C2 is delayed by a less than ideal delay amount but still within the acceptable range, the sampled scan out value would be "1," because the actual received test signal edge is before the dotted line. In a second test where C2 is delayed by less than the ideal delay amount but still within the acceptable range, the sampled scan out value would also be "1," because the actual received test signal edge is before C1's rising edge. Therefore, when the test signal is "1" and the I/O introduces a less than ideal amount of delay beyond an acceptable range, the two scan outputs with more-than-ideal and less-than-ideal C2 delays would both be "1."

The delay fault testing circuit described above can also be used for post-assembly test. The interconnected chips can be tested from one side; hence coordinated testing of both chips would not be necessary. This feature reduces testing time and complexity and facilitates more efficient and cost-effective post-assembly integrity test.

FIG. 6A illustrates an exemplary two-chip configuration for testing delay faults in their interconnects. In this example chips 606 and 604 are vertically stacked. A pass circuit 603 couples chip 606's output to its input, and pass circuit 602 couples chip 604's output to its input. During testing, pass circuit 603 is turned off, and pass circuit 602 is turned on. The delay circuit in chip 606 is configured properly to account for the extra delay introduced by chip 604. As a result, the test signal traverses the two contact points at the I/O interface, and the inter-chip delay faults can be detected.

Note that the testing can be done in both directions. As illustrated in FIG. 6B, pass circuit 602 is turned on, and pass circuit 603 is turned off. The test signal is transmitted from chip 604, passed by pass circuit 603, and received by the receiver on chip 604. Note that the pass circuits in these examples are bi-directional, so that a test signal can pass through the pass circuit from either side.

Figure 6C:
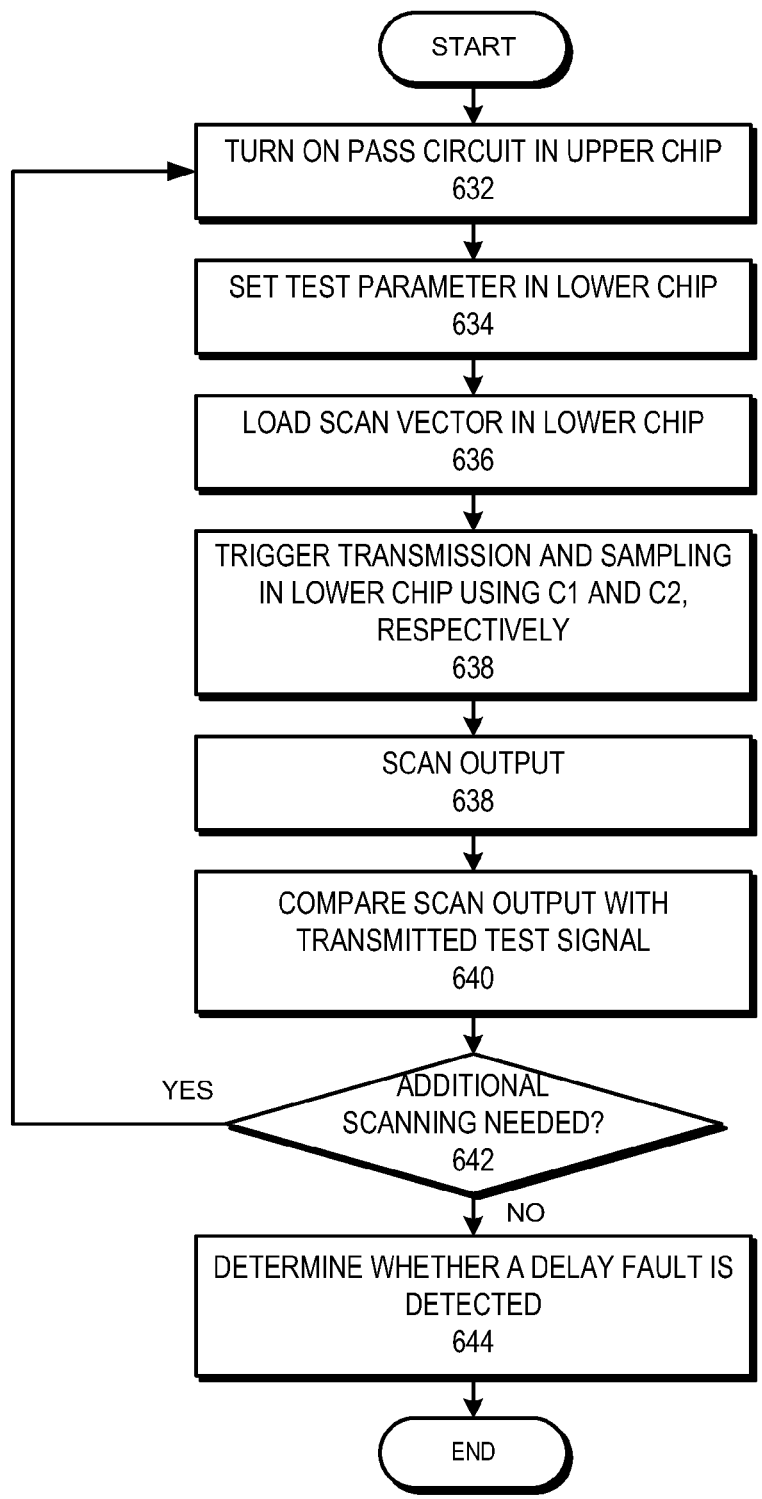
FIG. 6C presents a flowchart illustrating the process of testing delay fault in a pair of stacked chips, in accordance with one embodiment.

FIG. 6C presents a flowchart illustrating the process of testing delay fault in a pair of stacked chips with a configuration similar to that illustrated in FIG. 6A, in accordance with one embodiment. During the testing process, the pass circuit in the upper chip (such as chip 604 in FIG. 6A) is turned on (operation 632). Next, the test parameter in the lower chip (such as chip 606 in FIG. 6A) is set to account for the pass circuit delay and inter-chip delay (operation 634). The scan vector is then loaded into the lower chip (operation 636). Subsequently, transmission and sampling in the lower chip are triggered using C1 and C2 generated by the delay circuit in the lower chip, respectively (operation 638).

The SCN signal in the lower chip is set to scan the sampled test signal (operation 638). The test equipment then compares the scan output with the transmitted test signal (operation 640). In one embodiment, the test equipment can further determine whether additional scanning with a different delay parameter is needed (operation 642). If so, the testing sequence is repeated, starting from operation 632. Otherwise, the testing equipment determines whether a delay fault is detected (operation 644).

Typically, defects can be detected through changes in delay. For example, delays smaller than expected could indicate voids that reduce capacitance. Delays larger than expected could indicate defects to ground or other types of sink, which increase leakage conductance.

FIG. 7 illustrates another test configuration for two stacked chips. In this example, chip 703 is stacked on top of chip 701. Chip 702 includes a pass circuit 702. Chip 703 includes two pass circuits, 706 and 704. On chip 703, pass circuit 704 is placed between the output of driver 705 and the input of receiver 707. Pass circuit 706 is placed between the input of driver 705 and the output of receiver 707. By turning off pass circuits 702 and 706 and turning on pass circuit 704, the test equipment can test the delay characteristics of the driver and receiver on chip 701 and the interconnects (similar to the example in FIG. 6A). Alternatively, one can turn off pass circuits 702 and 704, and turn on pass circuit 706. This configuration allows testing of the drivers and receivers on both chips, and hence can provide more information on the health of the chip stack.

In one embodiment, the delay testing circuit can be used to detect delay faults in the I/O of a chip coupled to a substrate or interposer. For example, as illustrated in FIG. 8, a chip 801 can be placed next to a substrate 803 while being tested. The presence of substrate 803 changes the I/O capacitance, which in turn changes the I/O interconnects' delay characteristic. FIG. 9 illustrates another example, where two chips 901 and 905 are stacked with a substrate 903 as an interposer.

As mentioned earlier, the capacitance of the pass circuit should ideally be kept small, so that the associated parasitic capacitance to the I/O can be negligible. For the purposes of illustration, assume a typical semiconductor fabrication process in which the Fan-Out of 4 (FO4) delay is 15 ps and a minimum size nFET has a gate capacitance of 40 aF and a drain or source capacitance of 20 aF. If the TSV has a capacitance of 30 fF, then to achieve an FO4 delay, the driving inverter would need an input capacitance of ¼ that—approximately 8 fF. This capacitance value corresponds to approximately a 25× minimum-size driver. It is difficult, if not impossible, to size the transmission gate in the pass circuit so as to achieve this same delay when the chip is put to the test mode (loop-back). If nothing else, the pass circuit's load has another TSV on it. It would have to be a very large gate, say at least 25× minimum size in order to achieve even a 45 ps loaded delay. Such a large gate, when turned off, would increase the load on the driver by approximately 4 fF. This load would slow the driver down by 12% and increase its power consumption by 12%. On the other hand, if a 6× minimum-sized transmission gate is used for the pass circuit instead, the loop-back delay in test mode becomes large—over 200 ps; but the extra loading of the transmission gate (when off) would be less than 2%. Thus the delay and power impact in operation would be minimal.

Figure 10:
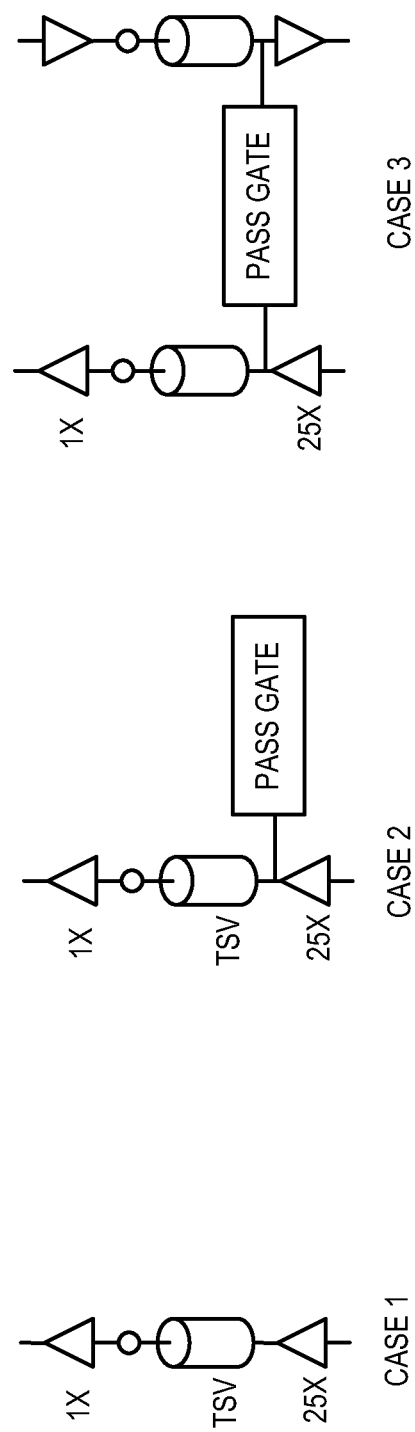
FIG. 10 presents different cases for estimating the additional signal delays introduced by the delay fault testing circuit, in accordance with one embodiment.

The different scenarios are illustrated in FIG. 10 and described below:

Case 1: Normal transmission and receiving without the pass circuit. The transmitter drives one TSV, so it needs to be a 25× minimum-size driver. The total nominal delay through the circuit is approximately 30 ps.

Case 2: With the pass circuit, during the normal operation mode. The impact of the pass circuit is as follows:
 a. Assume that the transmission gate in the pass circuit is large (25× minimum-size). This configuration increases the delay between two coupled chips by 12%. It also increases the interconnect power requirement by 12%. Both increased amounts are quite significant.
 b. Now assume that the transmission gate in the pass circuit is smaller (6× minimum-size). Both the parasitic loading and increase in power requirement are much smaller—approximately 3%, which is negligible.

Case 3: With the pass circuit, during test mode.
 a. With a large (25× minimum-size) transmission gate, the loop back delay is approximately 120 ps. Hence, timing adjustment is needed.
 b. With a small (6× minimum-size) transmission gate, the loop back delay is 280 approximately ps—only a different timing adjustment is needed.

Therefore, a small transmission gate in the pass circuit minimizes the parasitic capacitance with respect to the chip's I/O transmitter during normal regulation, at the cost the increased delay for the test signal. Nevertheless, this increased delay is accounted for by the delay circuit.

The pass circuit with logic can be a good target for synthesis by putting appropriate constraints on the timing of the path from the transmission flip-flop to the sampler flip-flop. Minimum and maximum timing constraints could be specified in the synthesis tool. A "no-touch" could be placed on the actual receiver and transmitter circuits, so that the strength of those does not change. These delays could be coordinated with the synthesis of the programmable delay circuit. For example, the latter could have multiple clock phases going to it, facilitating the generation of a delay to a fraction of a clock period. The allowed delays in the interconnect structure can then be calculated accordingly.

The above described embodiments may include fewer or additional components. Components may be combined into a single component and/or the position of one or more components may be changed.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit.

Although various formats may be used for such encoding, these data structures are commonly written in Caltech Intermediate Format (CIF), Calma GDS II Stream Format (GDSII) or Electronic Design Interchange Format (EDIF). Those of skill in the art of integrated circuit design can develop such data structures from schematic diagrams of the type detailed above and the corresponding descriptions and encode the data structures on a computer-readable medium. Those of skill in the art of integrated circuit fabrication can use such encoded data to fabricate integrated circuits comprising one or more of the circuits described herein.

While the present disclosure has been described in connection with specific embodiments, the claims are not limited to what is shown. Moreover, some components are shown directly connected to one another, while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. An apparatus, comprising:
 at least two electrically-coupled integrated circuit (IC) chips;
 each IC chip comprising a signal output via which an outgoing signal is transmitted, a signal input via which an incoming data signal is received, a pass circuit to couple the signal output to the signal input during testing of the IC chip, and a delay circuit to produce a first timing signal and a second timing signal during testing of the IC chip, the second timing signal being delayed from the first timing signal according to a test parameter, the first timing signal triggering transmission of a test signal via the signal output, and the second timing signal triggering sampling of the test signal via the signal input; and
 each IC chip configured to be programmed to define the test parameter in a manner so as to establish the respective delay by which the respective second timing signal is delayed by the respective delay circuit from the respective first timing signal by an amount including delay corresponding to the pass circuit.

2. The apparatus of claim 1, wherein for each IC chip the pass circuit comprises one or more of:
 a pass gate;
 a transmission gate;
 a logic gate;
 a tri-state gate; and
 a multiplexer.

3. The apparatus of claim 1, wherein for each IC chip the delay circuit comprises a programmable digital delay circuit.

4. The apparatus of claim 1, wherein for each IC chip the delay circuit comprises a programmable analog delay circuit.

5. The apparatus of claim 1, wherein for each IC chip the pass circuit comprises a pass gate the size of which is at most six times the size of a minimum-sized driver on the IC chip.

6. The apparatus of claim 1, wherein each IC chip further comprises:
 a scan chain comprising a number of flip-flops to receive a scan vector;
 a transmitter flip-flop configured to transmit the test signal from the IC chip in response to the first timing signal for the IC chip; and
 a receiver flip-flop configured to receive the test signal at the IC chip in response to the second timing signal for the IC chip.

7. The apparatus of claim 1, wherein the pass circuit respective to each IC chip is configured to de-couple the signal output from the signal input when the corresponding IC chip is not under test.

8. The apparatus of claim 7, wherein for each IC chip parasitic capacitance introduced by the pass circuit is less than 10% of an output capacitance at the signal output when the IC chip is not under test.

9. The apparatus of claim 1, wherein for each IC chip the delay circuit comprises a delay-configuration mechanism which facilitates configuration of the respective delay.

10. The apparatus of claim 9, wherein for each IC chip the delay-configuration mechanism comprises one or more registers to store a delay value.

11. A method, comprising, for each of at least two IC chips: coupling an output of the IC chip to an input of the IC chip via a pass circuit on the IC chip; transmitting a test signal via the output according to a first timing signal; sampling the test signal via the input according to a second timing signal; and configuring a delay for the IC chip between the first timing signal and the second timing signal; wherein the delay for each of the at least two IC chips is determined by a test parameter, the test parameter configured to be independently programmed for each of the at least two IC chips so as to define the test parameter to establish respective delay; and wherein the respective delay includes delay corresponding to the pass circuit.

12. The method of claim 11, wherein for each IC chip:
the transmitting is triggered by a first timing signal; and
the sampling is triggered by a second timing signal.

13. The method of claim 11, further comprising for each IC chip comparing the test signal sampled by the IC chip with the test signal transmitted by the IC chip.

14. The method of claim 11, further comprising for each IC chip obtaining a delay value via a corresponding scan chain.

15. The method of claim 11, further comprising for each IC chip:
in a first test, delaying the sampling by the IC chip from the transmitting by the IC chip by an amount that is greater than an expected delay between the output of the IC chip and the input of the IC chip; and
in a second test, delaying the sampling by the IC chip from the transmission by the IC chip by an amount that is less than the expected delay.

16. The method of claim 15, further comprising for each IC chip determining the signal path between the output of the IC chip and the input of the IC chip to be healthy or faulty, wherein for each IC chip: the signal path is determined to be healthy when the test signal as sampled by the IC chip has a binary state which is the same as a binary state the test signal transmitted by the IC chip in the first test and opposite from the binary state of the test signal transmitted by the IC chip in the second test; test, and the signal path is determined to be faulty when, in both the first and second tests, the test signal as sampled by the IC chip has a binary state which is the same as the binary state of the test signal transmitted by the IC chip, and the signal path is determined to be faulty when, in both the first and second tests, the test signal as sampled by the IC chip has a binary state which is opposite from the binary state of the test signal transmitted by the IC chip.

* * * * *